US006499134B1

(12) United States Patent
Buffet et al.

(10) Patent No.: US 6,499,134 B1
(45) Date of Patent: Dec. 24, 2002

(54) METHOD OF ASSIGNING INTEGRATED CIRCUIT I/O SIGNALS IN AN INTEGRATED CIRCUIT PACKAGE

(75) Inventors: Patrick H. Buffet, Essex Junction, VT (US); Paul E. Dunn, Fletcher, VT (US); Joseph Natonio, Poughkeepsie, NY (US); Robert A. Proctor, South Burlington, VT (US); Gulsun Yasar, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 194 days.

(21) Appl. No.: 09/615,149

(22) Filed: Jul. 13, 2000

(51) Int. Cl.[7] ................................................ G06F 17/50

(52) U.S. Cl. ............................. 716/12; 716/13; 716/14; 716/15

(58) Field of Search .............................. 716/1–21, 5, 9, 716/12–18

(56) References Cited

U.S. PATENT DOCUMENTS

| | | | |
|---|---|---|---|
| 4,875,047 A | | 10/1989 | Baba |
| 4,965,577 A | | 10/1990 | Baba |
| 5,471,397 A | | 11/1995 | Hsieh et al. |
| 5,535,133 A | | 7/1996 | Petschauer et al. |
| 5,555,506 A | | 9/1996 | Petschauer et al. |
| 5,596,506 A | | 1/1997 | Petschauer et al. |
| 5,724,251 A | * | 3/1998 | Heavlin ......................... 716/5 |
| 5,781,446 A | * | 7/1998 | Wu ............................... 716/9 |

OTHER PUBLICATIONS

IBM Technical Disclosure Bulletin, 12/95, "On–Chip Noise Reduction".

Signal Integrity Optimization on the Pad Assignment for High–Speed VLSI Design, Kai–Yuan Chao, Intel Corporation, DF. Wong, University of Texas at Austin.

IBM Technical Disclosure Bulletin, 5/88 Optimum Routing of Critical Circuit Timing Paths.

* cited by examiner

*Primary Examiner*—Vuthe Siek
*Assistant Examiner*—Naum B Levin
(74) *Attorney, Agent, or Firm*—Connoly, Bove, Lodge & Hutz, LLP; William D. Sabo

(57) ABSTRACT

A method for improving the crosstalk and time-of-flight performance for signals in an integrated circuit with respect to the package-related wiring. I/O pads in the package-related wiring of a logic design meeting specified crosstalk and time-of-flight constraints are identified using a software tool. The tool produces a graphical display in which the identified I/O pads are highlighted. The tool enables a user to graphically manipulate the display to assign, i.e., establish an electrical connection, between I/O circuits corresponding to the signals and the highlighted I/O pads.

20 Claims, 9 Drawing Sheets

METHOD OF ASSIGNING INTEGRATED CIRCUIT I/O SIGNALS IN AN INTEGRATED CIRCUIT PACKAGE

BACKGROUND OF THE INVENTION

The present invention relates to a method for improving integrated circuit (IC) performance in view of crosstalk and time-of-flight characteristics associated with package-related wiring for the IC.

Advances in IC design and manufacturing technologies have resulted in progressively smaller IC feature sizes, having commensurately lower operating voltages and packed more densely. Also, performance of ICs at increasingly higher frequencies is demanded. As such trends continue, the importance of handling performance-degrading factors such as crosstalk (coupling noise), and of reducing signal propagation times, also referred to as time-of-flight (TOF), becomes greater.

Higher device density on an IC chip, or die, requires correspondingly denser package-related wiring for carrying signals on and off the die, while the higher clock rates associated with higher frequencies require faster signal transition and reduced TOF for signals on and off the die. Thus. the crosstalk and TOF behavior of the package-related wiring for a die affect overall crosstalk and TOF performance.

Package-related wiring on an IC die can be implemented in a number of different forms, but typically includes at least I/O circuits coupled to "nets" or signals that are input or output to a logic design on the die. The I/O circuits receive input signals and drive output signals off the die, via connections to off-die package pads in a package containing the die. The package pads are in turn typically connected, via a card pad in a card including multiple die packages, to other package pads connected via I/O circuits to other logic designs.

As signals that may be input/output to a logic design approach the several hundreds or more and die interface speeds scale upward, the crosstalk and TOF characteristics of the package-related wiring become factors that significantly impact performance. Accordingly, a method for improving chip performance with respect to the crosstalk and TOF characteristics of the package-related wiring is needed.

SUMMARY OF THE INVENTION

A method according to the present invention provides for establishing an assignment of signals to package-related wiring such that the assignment meets desired crosstalk and TOF constraints.

In an embodiment, I/O circuits corresponding to signals that are input/output to a die in a package are selected for assignment to package wiring meeting defined crosstalk and TOF criteria.

In the foregoing embodiment, a software tool according to the invention uses a database including crosstalk and TOF characteristics for the package wiring to identify package wiring meeting crosstalk and TOF constraints specified by a user. The software tool produces a graphic display highlighting components of the package wiring in terms of their crosstalk and TOF characteristics, and allows a user to graphically assign the selected I/O circuits to wiring meeting the required constraints. The assignment of the I/O circuits constitutes part of a definition of a floorplan for the die which will result, when the die is physically fabricated, in package-related wiring corresponding to the assignment of I/O circuits and consequently having the desired crosstalk and TOF characteristics.

DETAILED DESCRIPTION OF THE INVENTION

Figure 1:
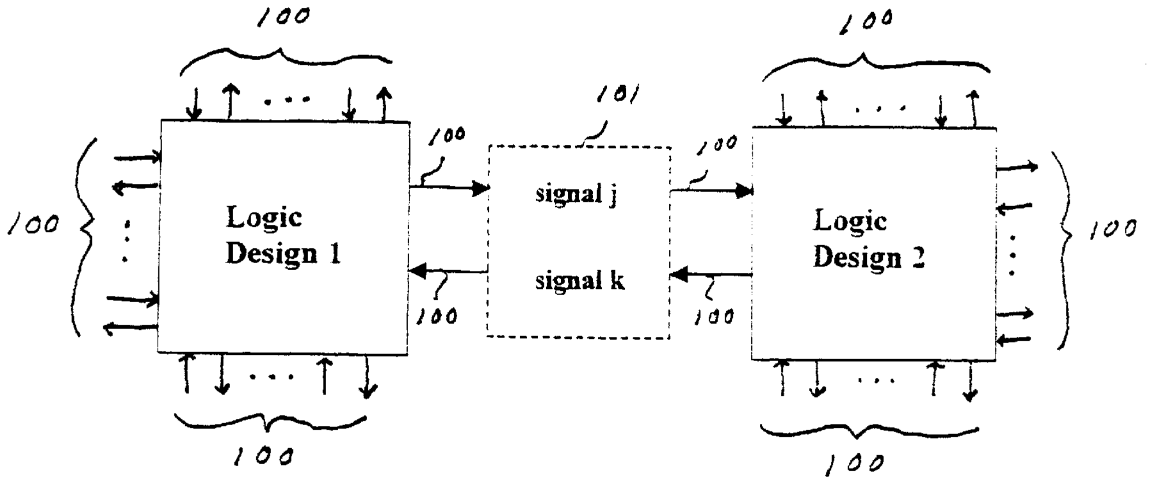
FIG. 1 shows I/O signals corresponding to two logic designs, and an interface between the designs.

In the method according to the present invention, I/O circuits corresponding to signals in a logic design are assigned to package wiring in accordance with crosstalk and TOF constraints imposed by the design. As an illustrative example, FIG. 1 shows a representation of two logic designs, a logic design 1 and a logic design 2 having input and output signals 100. The logic designs have an interface 101 comprising a signal j and a signal k. Signal j is an output of logic design 1 and is input to logic design 2; signal k is an output of logic design 2 and is input to logic design 1.

Typically, performance parameters of their respective designs place crosstalk and TOF constraints on signals such as signals j and k. The interface 101, for example, may be a very high speed interface, requiring low TOF, and signals j and k may be high priority signals that must be transmitted with a minimum of probability of corruption due to crosstalk.

Figure 2:
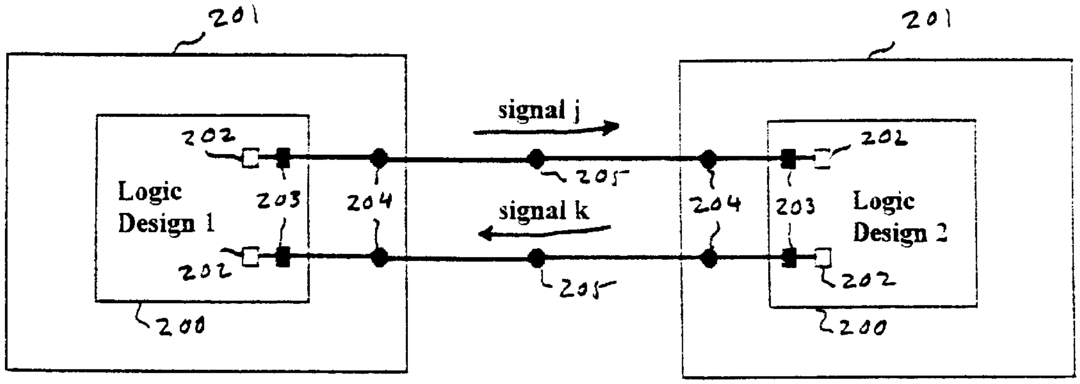
FIG. 2 shows a schematic representation of electrical connections for propagating signals between the two logic designs.

FIG. 2 shows a schematic representation of a system for physically transmitting signals j and k. Typically, dies 200 comprising silicon layers for physically implementing logic designs such as logic designs 1 and 2 are housed in a package 201 made of a dielectric material such as ceramic or plastic. Signal j is electrically connected to an I/O circuit 202 connected to an I/O pad 203. The I/O pad is connected to a package pad 204 associated with the package 201 containing logic design 1. The package pad 204 is electrically connected to a card pad 205. The card pad 205 is electrically connected to a package pad 204 associated with a package 201 containing logic design 2. The package pad is electrically connected to an I/O pad 203 which is electrically connected with an I/O circuit 202 in logic design 2.

Similarly, signal k is electrically connected to an I/O circuit 202 which is connected to an I/O pad 203. The I/O pad is connected to a package pad 204 associated with a package 201 containing logic design 2. The package pad is electrically connected to a card pad 205. The card pad is electrically connected to a package pad 204 associated with a package 201 containing logic design 1. The package pad is electrically connected to an I/O pad 203 which is electrically connected with an I/O circuit 202 in logic design 1.

The I/O circuits. I/O pads, package pads, card pads and connections therebetween described in the foregoing are components of the package-related wiring. Crosstalk between signals such as signals j and k in portions of the package-related wiring. for example, between an I/O circuit 202 and a package pad 204 may be present and must be accounted for. Similarly, TOF from an I/O circuit to a package pad is a factor in the speed of the interface between logic designs 1 and 2.

Typically, the components of the package wiring do not have uniform electrical characteristics. The electrical characteristics can vary according to the package type, the location of the wiring pads, and other factors including the number of wiring planes in the package, the total length of the connection through the package and the percentage of the total length of connection on each layer of the package. Depending on their characteristics, some pads yield better crosstalk and TOF performance than others when connected to signals. Accordingly, which pads are used for which signals affects the overall design performance.

According to the present invention, I/O circuits corresponding to signals of a logic design are assigned to I/O pads in order to satisfy crosstalk and TOF constraints such that a desired design performance is met. Typically, this would entail an evaluation by a designer or design team of the relative priority of the signals. The highest priority signals would typically have the most restrictive crosstalk and TOF constraints, while signals of lesser priority would have less restrictive constraints. The signals would typically be processed according to the invention in an order based upon the evaluation of their relative priorities.

Other design considerations which affect the assignment of I/O circuits to I/O pads include physical and electrical constraints of the design and existing floorplan connections. These factors are also handled by the invention as discussed in greater detail below.

Figure 3A:
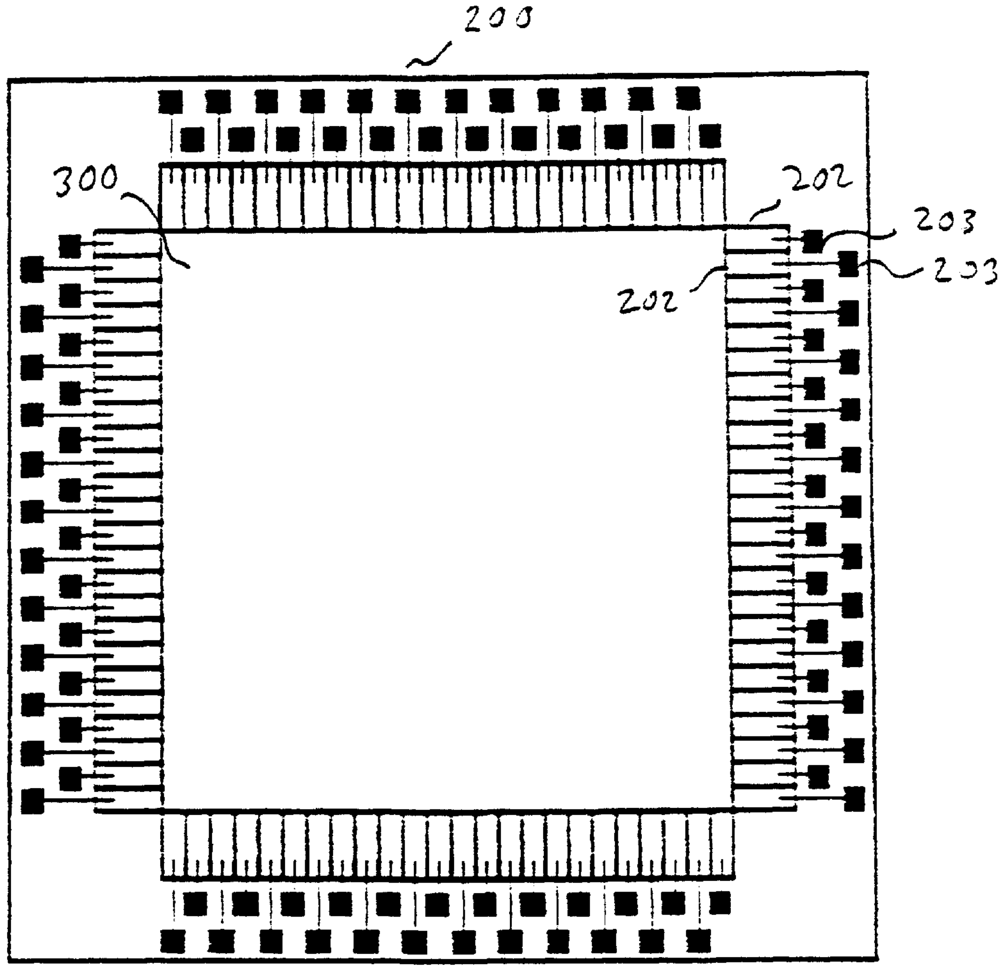
FIGS. 3A–3C show different types of on-die wiring corresponding to different types of die images.
Figure 3B:
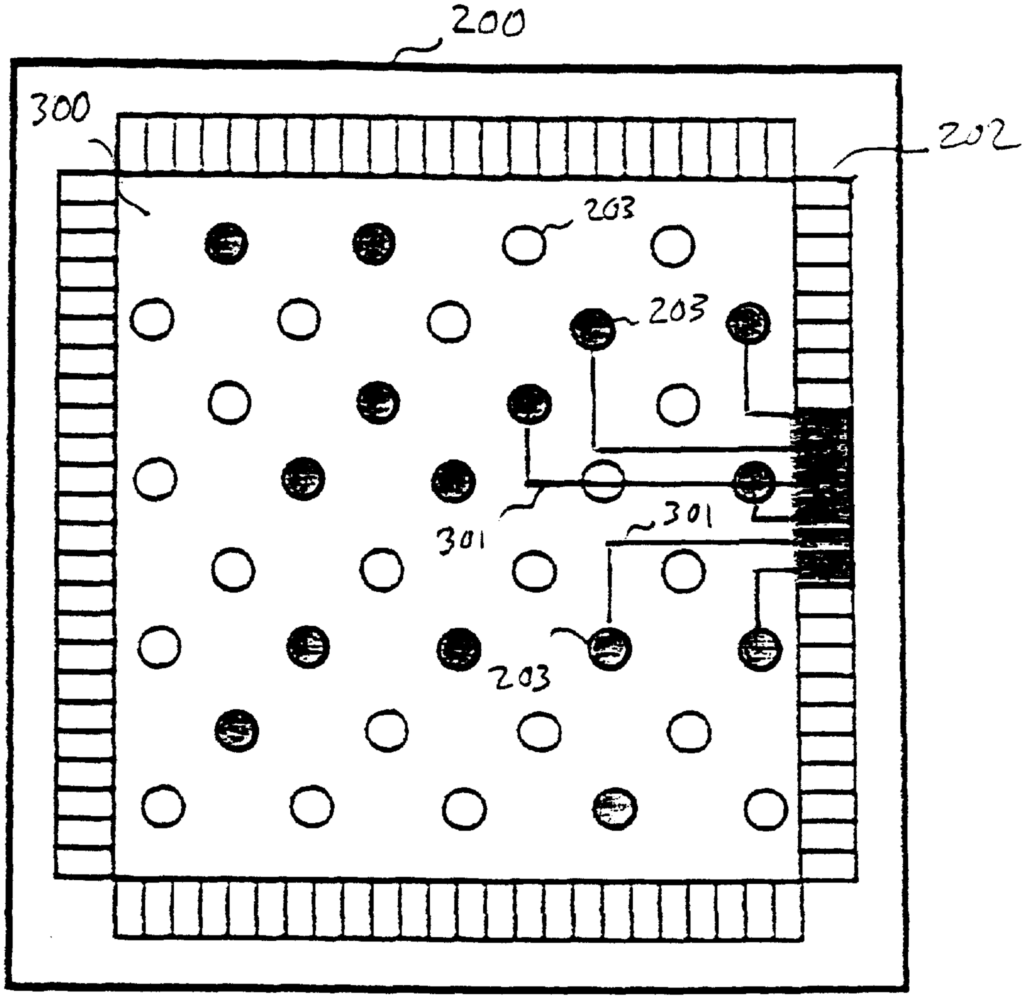
Figure 3C:
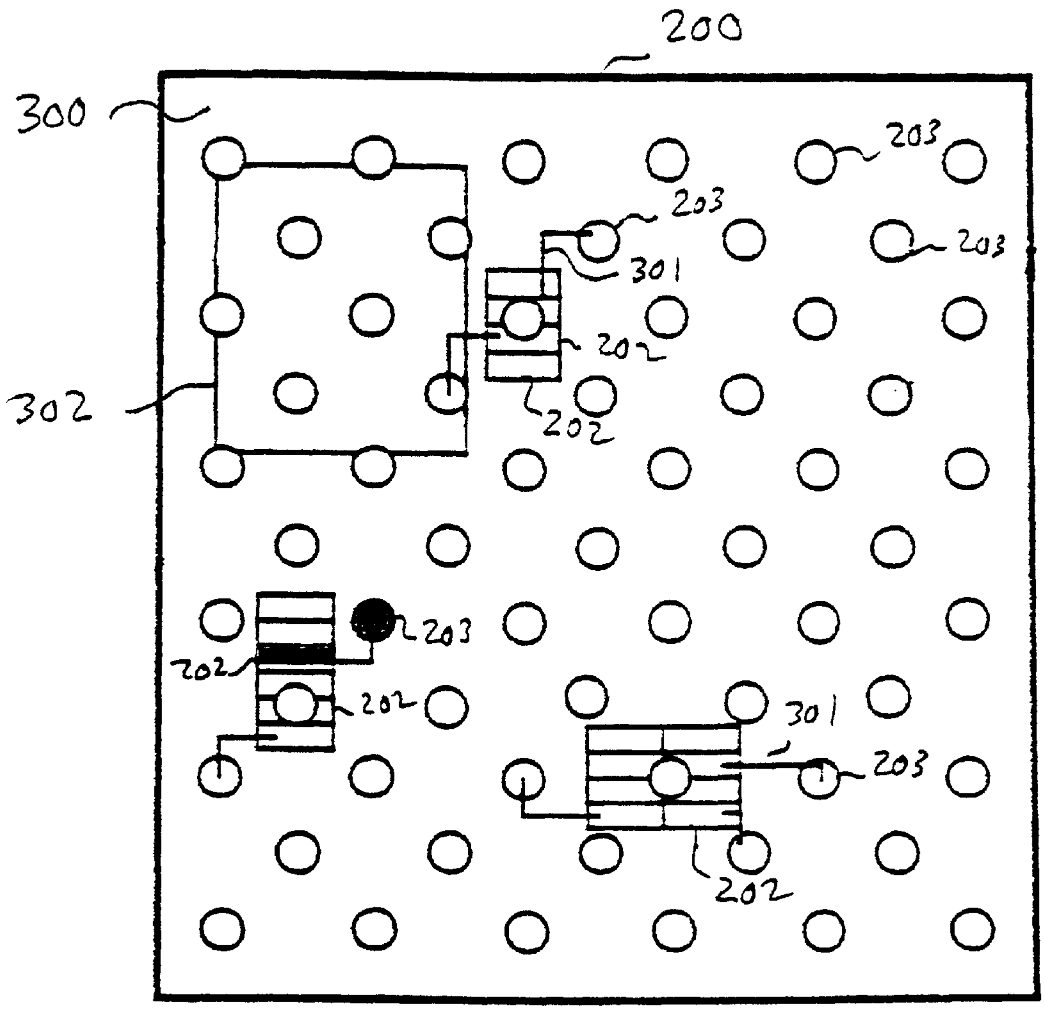

FIGS. 3A–3C show examples of some existing types of die layouts to which the method of the present invention may be advantageously applied. FIG. 3A shows a die image known as a "peripheral wirebond" image in which the I/O circuits 202 are peripheral to a die logic area 300. An "image" refers to a basic template defining the die size, the locations of basic components such as power buses and pads, and other basic landmarks of the die. A package containing a die of this type is known as a "wirebond" package. The I/O pads 203 are implemented as wirebond pads. The I/O pads are electrically connected via wirebond connections to package pads 204 (not shown) which may be located below layers of the body of the package consisting of dielectric material, routing layers and layers of structural material which make up the package.

FIG. 3B shows another type of die image known as a "flipchip" image in which the I/O circuits 202 are peripheral to die logic area 300. A distribution of I/O pads 203 is shown throughout the die logic area 300. The I/O pads may be electrically connected via connections 301 to I/O circuits 202. Multiple die layers are illustrated in the same plane. The I/O pads 203 would typically occupy an upper metal layer of the die.

The die utilizes a "bump pad attach" package. In a bump pad attach package, a solder ball may exist on both the package and the die. With the use of solder balls, when the die is correctly positioned in alignment with the package and the temperature elevated, solder re-flow occurs and the die becomes electrically attached to the package. Thus, in FIG. 3B the I/O pads 203 are implemented as C4 solder balls. The I/O pads are electrically connected to package pads 204 (not shown).

In a peripheral arrangement as shown in FIGS. 3A and 3B. each I/O circuit 202 resides in an "I/O slot" electrically connected to an I/O pad. An I/O slot is a fixed area, in terms of its location on the die, in which an I/O circuit may be placed. By contrast, FIG. 3C shows a type of die image known as an "area-array" image in which I/O circuits may be placed or assigned not only peripherally to the die logic area in fixed slots, but anywhere within snap grids defined for I/O circuits of the die. Snap grids for I/O circuits are typically aligned with the major horizontal and vertical power buses.

In FIG. 3C, multiple die layers are illustrated in the same plane. For example, area 300 with placed logic circuits or area 302 with macros, i.e., pre-defined areas of logic already placed and routed, would typically reside on a lower layer of the die. The I/O pads 203 are distributed across the die logic area 300 and typically occupy an upper metal layer of the die. Similarly, I/O circuits 202 may be distributed throughout the die logic area. A routed connection 301 is made between an I/O circuit 202 and an I/O pad 203, allowing flexibility in the placement of the I/O circuit in the proximity of the I/O pad. The routed connection 301 is made between layers of metallurgy M1 to M6. with the M1 layer connecting to devices of the I/O circuit and to M2, M2 connecting to M1 and M3, M3 connecting to M2 and M4, and so on.

Figure 4A:
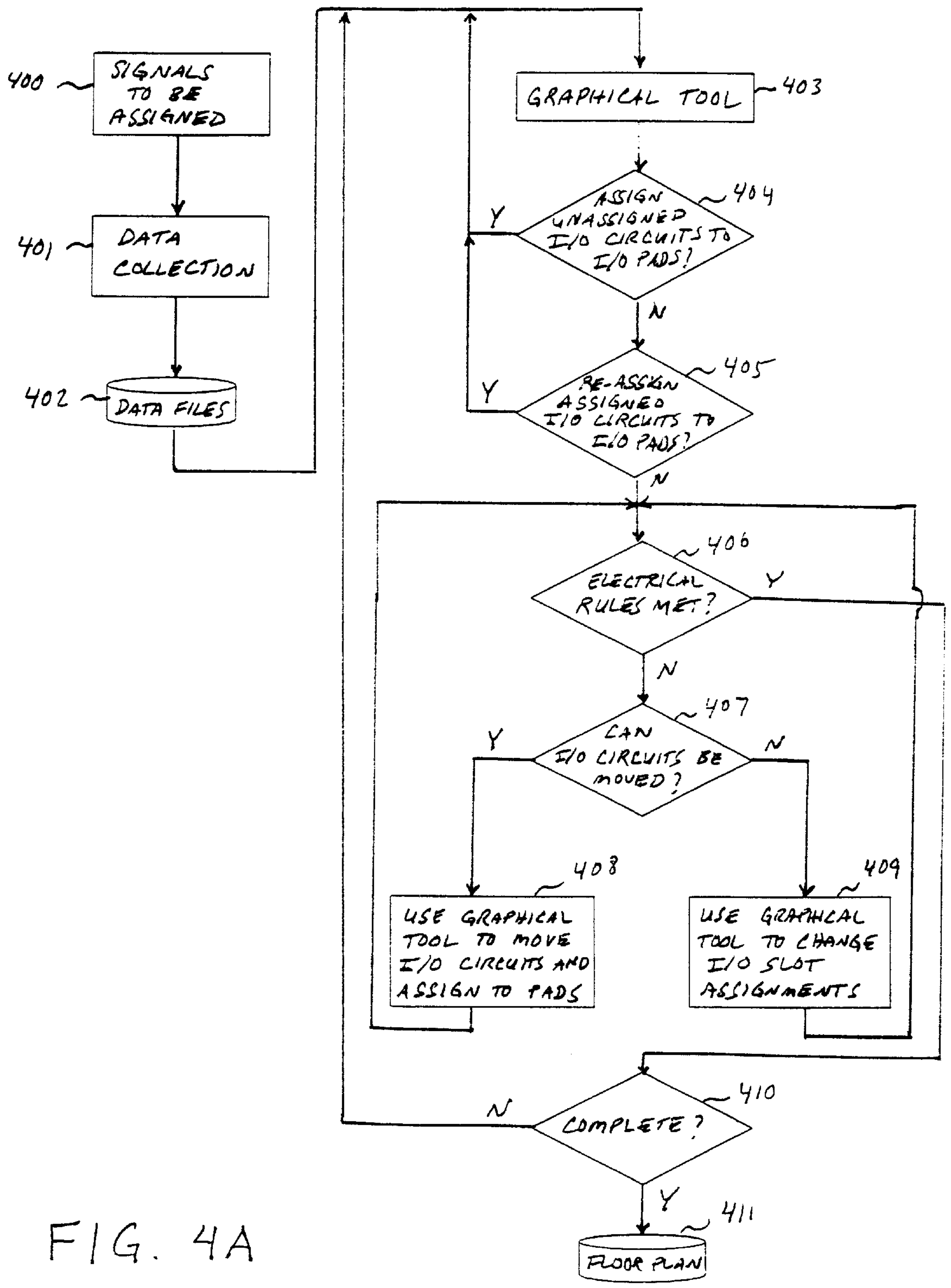
FIGS. 4A–4C show a process flow for an embodiment of the method according to the present invention.
Figure 4B:
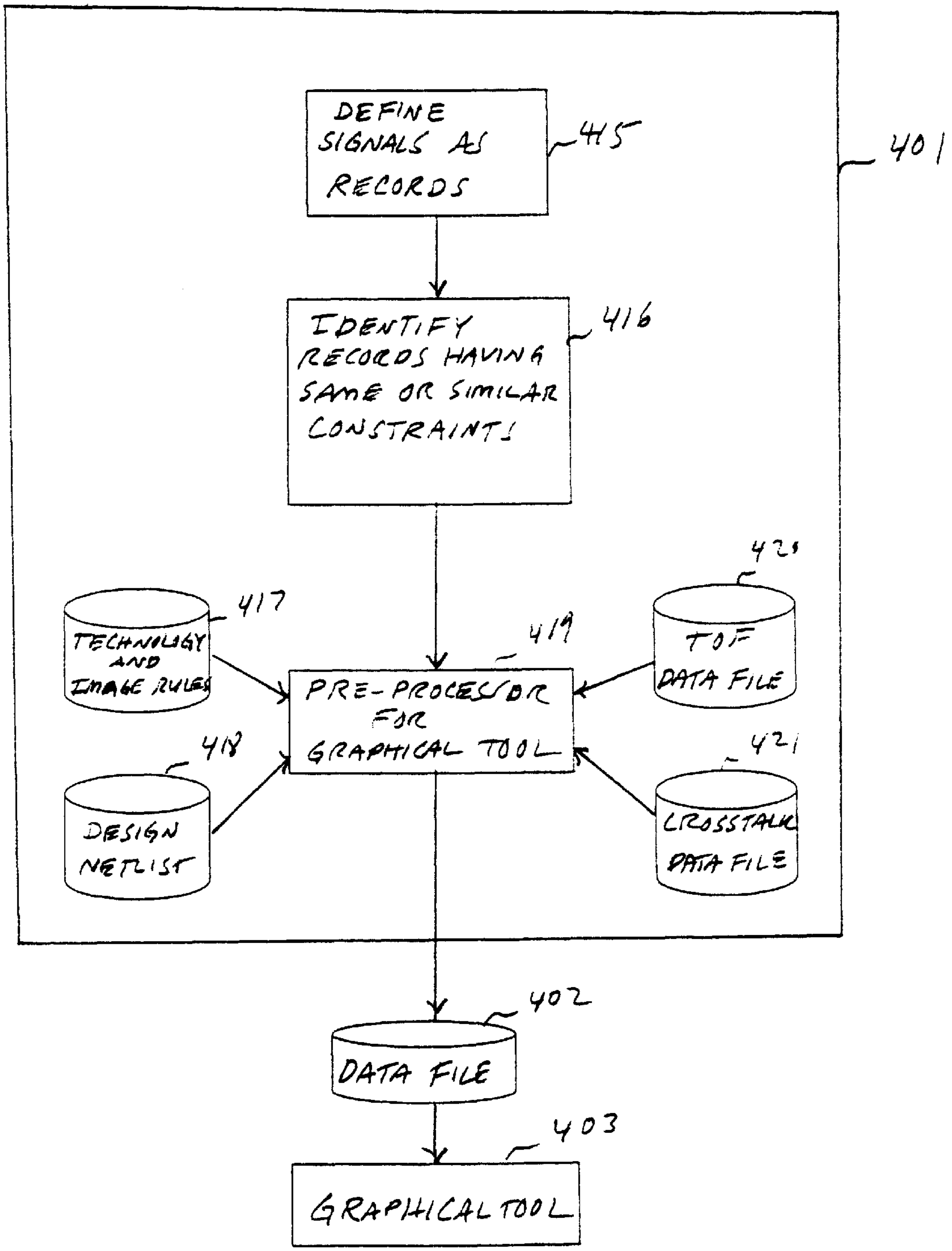
Figure 4C:
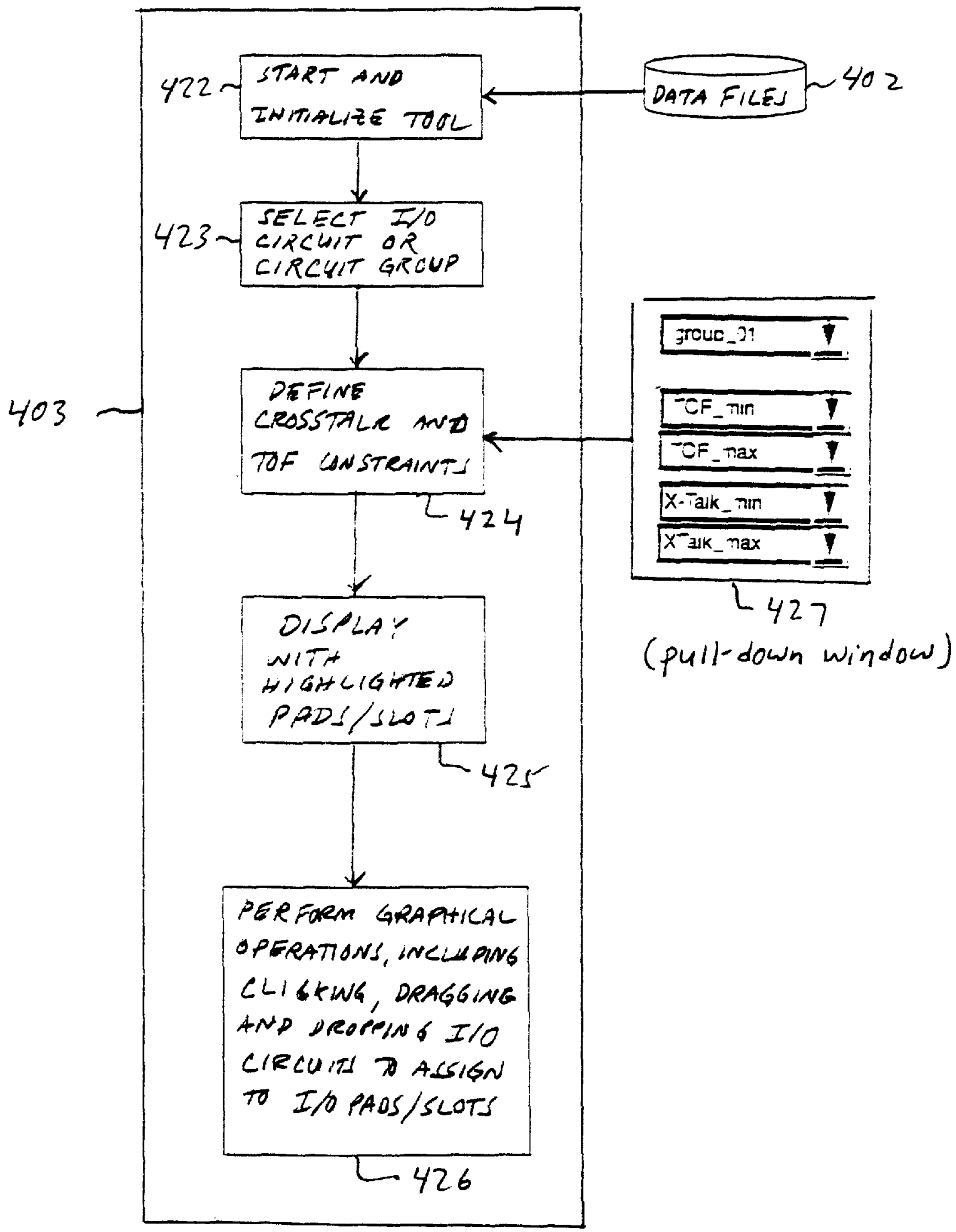

FIGS. 4A–4C show a processing flow for a method according to the present invention. In a typical application of the method, sets of signals are processed in order of priority. I/O circuits corresponding to the highest priority signals are assigned to those I/O slots or pads and corresponding package pads having the best crosstalk and TOF characteristics, and these assignments are fixed. Subsequently, I/O circuits corresponding to lesser priority signals are assigned to I/O pads and corresponding package pads, working around the previously fixed assignments. Ultimately, a design floorplan, i.e., an assignment of area, shape and location on a die image to the various design elements, is arrived at having I/O circuits arranged in a distribution, in terms of their connections to I/O pads and package pads. which corresponds to signal priority.

Block 400 of FIG. 4A shows an initial step of providing signals to be assigned according to the method of the invention. Steps of the method include executing software according to the invention. Block 401, for example, shows a subsequent step of executing software for data collection and manipulation to create records corresponding to the signals to produce an output data file 402 suitable for handling by a graphical tool.

FIG. 4B shows block 401 in greater detail. In an embodiment, each signal to be assigned, via an I/O circuit, to an I/O slot or pad is defined as a record in a data file. as shown in block 415. As shown in block 416, the records may be grouped according to their respective crosstalk and TOF constraints. For example, a bus might comprise a group of signals all having identical crosstalk and TOF constraints. The records corresponding to this group of signals would accordingly be tagged with arbitrary identifiers associating each of the signals with the same group. For example, keywords such as "TOF__grp=<group name>" and "XTalk__grp=<group name>" could identify a record as belonging to a group having the same TOF constraints and the same crosstalk constraints, respectively. Among other things, this step facilitates the handling of groups of circuits by the graphical tool as described in more detail below.

Next, as shown in block 419, the records are further processed for subsequent handling by a software graphical tool according to the invention. Inputs to this step include a file 417 containing technology and image rules, a design netlist 418, a TOF data file 420 per package type, and a crosstalk data file 421 per package type.

The technology rules of file 417 relate to die-specific information including die size and X-Y locations of each I/O slot, for peripheral images, which is suitable for accommodating an I/O circuit 202. X and Y refer to orthogonal axes used in a coordinate system for defining locations on a die. The technology rules further relate to I/O circuit information including the number of I/O slots occupied, power supply requirements, number of wiring planes used by internal electrical connections, current draw requirements, electromigration limits and physical locations of the logic terminals of the I/O circuit.

The image rules define a die size and the package that it is positioned on. For example, a 10 mm peripheral die might be suitable for being positioned on ten different packages. Each of the combinations of a die and a package would have a file provided by the image rules describing the die-related characteristics such as die size, I/O slot X-Y locations and number of routing layers on the die. Other information in the file includes the I/O slot types, which identifies I/O slots reserved for VDD and GND connections, I/O slots reserved for testing purposes, and I/O slots available for I/O circuits. This information is used to validate a correct I/O assignment.

Similarly, technology and image rules for area-array die and package combinations include information relating to the die size, I/O pad locations, reserved I/O pads, and routing layers on the die. Also included is a definition of snap grids, aligned with major horizontal and vertical power buses, within which I/O circuits may be placed.

Files 420 and 421 supply information on the TOF and crosstalk characteristics, respectively, of a package based on such factors as the combination of die size. I/O pad placement, package size and the arrangement of package pins on the package.

As noted above, also input to pre-processing step 419 is the logic design netlist 418, including placement location information for macros, I/O circuits and logic cells. The placement location information comprises X-Y location and a mirror/rotate code. Macros are pre-designed portions of logic, already placed and routed, which can be retrieved from a library and placed as a unit within a larger logic design.

Netlists are typically generated by a process known as "logic synthesis" and further comprise a list of the input and output signals ("nets") of a design and detailed synthesized logic in addition to the signals and X-Y locations noted above. To reduce the volume of data which must be handled and increase processing speed, the pre-processing step extracts only the information it requires from the netlist, which includes the signal names for I/O circuits, the X-Y location and mirror/rotate code for macros and I/O circuits.

The pre-processing step 419 uses the above-described input files to produce an output data file 402 for processing by the graphical tool 403. The pre-processing step reads the TOF and crosstalk data files 420 and 421 and writes data fields to the records of the output data file 402. The pre-processing step creates placement records in the data file 402 for locations of placed macros and I/O circuits in the netlist 418. These placement records establish an initial graphical pattern for a display generated by the graphical tool.

The operation of the graphical tool 403 is shown in more detail in FIG. 4C. As shown in block 422, a user may start and initialize the tool at any time once the data file 402 created by the data collection step 401 is available. The graphical tool produces a number of displays on a display device. The displays may be manipulated by means of user input devices such as a keyboard or a computer mouse.

One display includes a list of unassigned I/O circuits and allows a user to select an unassigned circuit or circuit group for which to specify crosstalk and TOF constraints, as shown in block 423. Each of the I/O circuits is associated with a signal name provided by the netlist. The user may specify constraints via pull-down windows which allow the user to enter a permissible range of crosstalk and TOF values for the selected circuit or group of I/O circuits, as shown in blocks 424 and 427. For example, "TOF_min" corresponds to a minimum allowable TOF value, while "TOF_max" corresponds to a maximum allowable TOF value. Similarly, "X-Talk_min" corresponds to a minimum allowable crosstalk value, while "X-Talk_max" corresponds to a maximum allowable crosstalk value.

As shown in block 425, the graphical tool uses the information provided by input data file 402 to create a display representing the geometries of the die, the I/O circuit sizes, the location of I/O slots for peripheral images, and I/O pad locations for area-array images. In the display, the I/O slots or pads meeting the crosstalk and TOF constraints specified in step 424 are highlighted. The highlighting may take any of several forms, including color or shadow or both.

As shown in block 426, the graphical tool allows a user to select from multiple graphical operations for assigning an I/O circuit to an I/O pad. A user may, for example, use a mouse to perform a "click-drag and drop" operation to assign an I/O circuit. The user manipulates a mouse to position a pointer over an I/O circuit, clicks a mouse button to select the I/O circuit, drags the mouse to re-position the I/O circuit adjacent a highlighted I/O pad or slot, and releases the mouse button to "drop" the I/O circuit into place.

In the case of a peripheral image as in, for example, FIGS. 3A and 3B, the I/O circuit would be dropped into a highlighted I/O slot. In the case of an area-array image as in FIG. 3C, the I/O circuit would be dropped within a range of a highlighted I/O pad. Thus, in the case of the area-array image, the X-Y location an I/O circuit is not restricted to a corresponding I/O slot. Instead, there is flexibility in the placement of the I/O circuit within a range of an I/O pad.

The foregoing operations may also be performed with groups of I/O circuits being selected, by a click-drag operation or by being added to a select list, and being simultaneously dragged and dropped in highlighted I/O slots for the case of peripheral images, or near highlighted I/O pads for the case of area-array images. For the area-array image, the option also exists of requesting the software to randomly assign the I/O circuits, without a manual click-drag-and-drop operation. This might be done, for example, if there were significantly more I/O pads meeting assignment criteria than there were I/O circuits to assign.

The "dropping" step described above constitutes the assignment of the I/O circuits to the pads or slots. The assignment fixes the I/O circuit in a particular location in the design floorplan and establishes that when the design is fabricated an electrical connection will be formed between the I/O circuit and the I/O pad and its corresponding package pad.

Returning now to FIG. 4A, as shown in the process flow following block 403, after an application of the graphical tool to assign I/O circuits, a phase is entered for evaluating the assignments made for compliance with electrical rules of the design, and adjusting the assignments accordingly. First, as shown in blocks 404 and 405, a determination may be made as to whether a user wishes to assign any of remaining unassigned circuits, and the option is provided for re-assigning circuits already assigned.

If the user does not wish to continue to assign unassigned circuits, or re-assign already assigned circuits, a step 406 is performed to check whether basic electrical rules associated with the design are met. These rules are established arbitrarily by a user and may include, for example, a rule that no two circuits can occupy the same location spatially; that circuits must be placed within certain locations within a grid defined on the layout, and that circuits, especially high-powered circuits, can not be too close to each other, so that electro-migration effects are avoided. If the electrical rules are not met for a particular assignment of I/O circuits, the I/O circuits may be re-assigned and checked again for compliance with the electrical rules.

The process flow for determining compliance with electrical rules and changing assignments accordingly depends upon the die image type. This derives from the fact that, as noted above, in the peripheral images illustrated in FIGS. 3A and 3B. an I/O circuit resides in an I/O slot in a fixed X-Y location. In other configurations, for example the area-array I/O image illustrated in FIG. 3C, I/O circuits can be positioned anywhere within a range of a pad or pads, and be assigned to any of a plurality of nearby pads. Accordingly, depending upon whether or not the die image type allows circuits to be moved to a different X-Y location with respect to a pad or pads, as determined by step 407, different graphical operations are performed.

If it is determined from block 407 that the I/O circuits can be re-positioned, the I/O circuits may be moved using the graphical tool as described above, and assigned to the pads meeting the desired crosstalk and TOF requirements, as shown in block 408. Blocks 406 and 408 may be iterated a plurality of times until an assignment of I/O circuits is arrived at which complies with the electrical rules.

If a die image is not of a type where the I/O circuits can reside in unfixed X-Y locations, such as a peripheral image, blocks 406 and 409 may be performed iteratively, to use the graphical tool to change I/O slot assignments until the electrical rules are met.

As shown in block 410, a user can continue to use the graphical tool, returning to step 423 of selecting I/O circuits for assignment and proceeding thenceforward. When the assignment process is completed, a floorplan file 411 is produced. As noted above, the floorplan will have I/O circuits arranged in a distribution, in terms of their connections to I/O pads and corresponding package pads, which corresponds to signal priority.

Figure 5:
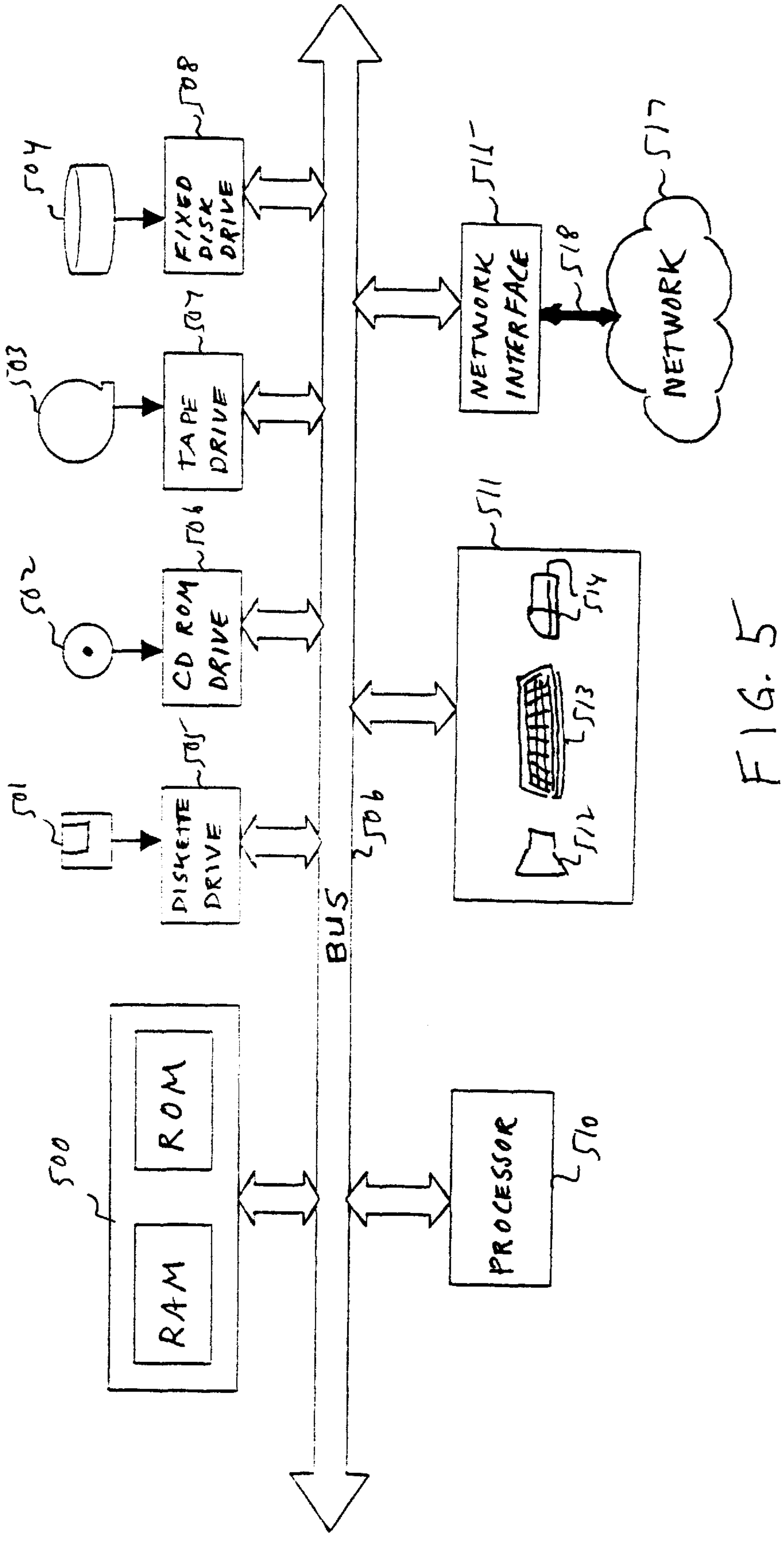
FIG. 5 shows a computer system for practicing the method of the invention.

FIG. 5 shows a high-level representation of a computer system for implementing a preferred embodiment of the present invention, such as might be realized by a variety of known and commercially available hardware and software elements as embodied in, for example, a UNIX® workstation. The system comprises a memory 500 including ROM and RAM, processor 510 and user interface 511 comprising a video display 512, keyboard 513 and mouse 514. Elements may communicate via system bus 506. The system may further be connected to a network 517 via a network medium 518 and network interface 515.

A computer program or collection of programs comprising computer-executable instructions for performing method steps according to the present invention may be stored and transported on computer-usable media such as diskette 501, CD-ROM 502, magnetic tape 503 and fixed disk 504. To perform the steps of the method, computer instructions according to the present invention may be retrieved from the computer-usable media 501–504 using their respective drives 505–508 into memory 500, and executed by a processor 510. The programming structures and functionality disclosed hereinabove for performing the method may find specific implementations in a variety of forms, which are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method comprising:

selecting I/O circuits of a logic design; and assigning the I/O circuits to I/O pads of a package of the logic design in accordance with a desired crosstalk and time-of-flight constraints for signals corresponding to said I/O circuits associated with the I/O pads.

2. The method of claim 1 wherein the step of assigning includes the steps of:

prioritizing the I/O circuits according to their time-of-flight constraints; and assigning the I/O circuits to I/O pads of the package of the logic design according to their prioritization.

3. The method of claim 2, wherein said step of assigning includes graphically manipulating I/O circuits corresponding to said signals to position them adjacent to said I/O pads meeting said constraints.

4. A method comprising:

highlighting I/O pads in a graphical display of a logic design layout in accordance with specified crosstalk and time-of-flight constraints; and assigning I/O circuits to said highlighted I/O pads, said I/O circuits carrying signals to and from said logic design.

5. The method of claim 4, wherein said step of assigning includes manipulating said graphical display to position said I/O circuits adjacent to said highlighted I/O pads.

6. The method of claim 5, wherein a selecting and moving operation is performed with a user interface device to position said I/O circuits.

7. The method of claim 4, wherein said I/O circuits are arranged peripherally to said logic design.

8. A computer-usable medium storing computer-executable instructions which when executed implement a process comprising:

applying specified crosstalk and time-of-flight constraints for signals in a logic design to a database including crosstalk and time-of-flight information for package-related wiring;

identifying I/O pads in said package-related wiring meeting said constraints; and producing a graphical display of said logic design in which said identified I/O pads are highlighted.

9. The computer-usable medium of claim 8, said process further comprising invoking a graphical tool for manipulating said graphical display, said graphical tool enabling the positioning of said I/O circuits adjacent to said I/O pads.

10. The computer-usable medium of claim 8, said database further including a netlist corresponding to said design, and technology and image rules corresponding to said package-related wiring.

11. A computer system comprising:

a memory containing computer-executable instructions;

a processor coupled to said memory for executing said instructions; and display means coupled to said processor for generating a graphical display in accordance with said instructions;

wherein:

said graphical display includes an image of a logic design having I/O pads highlighted in accordance with user-specified crosstalk and time-of-flight constraints.

12. The computer system of claim 11, further comprising a user interface for graphically assigning selected I/O circuits of said image to said highlighted I/O pads.

13. The computer system of claim 11, wherein said user interface includes means for manipulating said graphical display to position I/O circuits in said image adjacent to said highlighted I/O pads.

14. The computer system of claim 12, further comprising a design floorplan resulting from a process of graphically assigning said I/O circuits.

15. A method comprising:

highlighting I/O pads, distributed in a die logic area, in a graphical display of a logic design layout in accordance with specified crosstalk and time-of-flight constraints; and assigning I/O circuits to said highlighted I/O pads, said I/O circuits signals to and from said logic design layout.

16. A method comprising:

highlighting I/O pads, distributed in a die logic area, in a graphical display of a logic design layout in accordance with specified crosstalk and time-of-flight constraints; and assigning I/O circuits to a range of said highlighted I/O pads, said I/O circuits carrying signals to and from said logic design layout.

17. An apparatus comprising:

means for highlighting I/O pads, distributed in a die logic area, in a graphical display of a logic design layout in accordance with specified crosstalk and time-of-flight constraints; and means for assigning I/O circuits to said highlighted I/O pads, said I/O circuits carrying signals to and from said logic design layout.

18. An apparatus comprising:

means for highlighting I/O pads, distributed in a die logic area, in a graphical display of a logic design layout in accordance with specified crosstalk and time-of-flight constraints; and means for assigning I/O circuits to a range of said highlighted I/O pads, said I/O circuits carrying signals to and from said logic design layout.

19. A computer program product comprising;

a computer usable medium having computer readable program code means embodied in the medium, the computer readable program means including:

means for highlighting I/O pads, distributed in a die logic area, in a graphical display of a logic design layout in accordance with specified crosstalk and time-of-flight constraints; and means for assigning I/O circuits to said highlighted I/O pads, said I/O circuits carrying signals to and from said logic design layout.

20. A computer program product comprising:

a computer usable medium having computer readable program code means embodied in the medium, the computer readable program means including:

means for highlighting I/O pads, distributed in a die logic area, in a graphical display of a logic design layout in accordance with specified crosstalk and time-of-flight constraints; and means for assigning I/O circuits to arrange of said highlighted I/O pads, said I/O circuits carrying signals to and from said logic design layout.

* * * * *